United States Patent
McQuilkin (10) Patent No.: US 10,209,307 B2
(45) Date of Patent: Feb. 19, 2019

(54) MULTIPLE-LEVEL DRIVER CIRCUIT WITH NON-COMMUTATING BRIDGE

(71) Applicant: Analog Devices, Inc., Norwood, MA (US)

(72) Inventor: Christopher C. McQuilkin, Hollis, NH (US)

(73) Assignee: Analog Devices, Inc., Nonwood, MA (US)

( * ) Notice: Subject to any disclaimer, the term of this patent is extended or adjusted under 35 U.S.C. 154(b) by 0 days.

(21) Appl. No.: 15/162,171

(22) Filed: May 23, 2016

(65) Prior Publication Data

US 2017/0336473 A1 Nov. 23, 2017

(51) Int. Cl.
*H03K 17/00* (2006.01)
*G01R 31/319* (2006.01)

(52) U.S. Cl.
CPC ............... *G01R 31/31928* (2013.01)

(58) Field of Classification Search
CPC ............... G01R 31/3183; H03K 17/74
USPC ................... 324/762.07; 714/738
See application file for complete search history.

(56) References Cited

U.S. PATENT DOCUMENTS

| | | | |
|---|---|---|---|
| 4,092,589 A * | 5/1978 | Chau | G01R 31/31924 714/700 |
| 4,437,096 A * | 3/1984 | Brightman | H03K 17/6257 327/484 |
| 4,605,894 A * | 8/1986 | Cox | G01R 31/31924 324/537 |
| 5,010,297 A | 4/1991 | Babcock | |
| 5,276,355 A * | 1/1994 | Nagata | G01R 31/2886 307/115 |
| 5,493,519 A | 2/1996 | Allen, III | |
| 5,745,003 A | 4/1998 | Wakimoto et al. | |
| 5,781,059 A * | 7/1998 | Shiotsuka | H03K 17/76 327/109 |
| 6,166,569 A | 12/2000 | McQuilkin | |
| 6,172,551 B1 | 1/2001 | Hilton | |
| 6,414,496 B1 | 7/2002 | McQuilkin | |
| 6,717,450 B1 | 4/2004 | Linder | |
| 8,901,972 B2 | 12/2014 | McQuilkin | |
| 2004/0027165 A1 * | 2/2004 | Shimasaki | H03K 17/04113 326/91 |
| 2008/0054970 A1 | 3/2008 | Turvey et al. | |
| 2014/0191783 A1 * | 7/2014 | McQuilkin | H03K 19/0185 327/108 |

OTHER PUBLICATIONS

"U.S. Appl. No. 15/162,171, Examiner Interview Summary dated Sep. 15, 2017", 3 pgs.

* cited by examiner

*Primary Examiner* — Kenneth B Wells
(74) *Attorney, Agent, or Firm* — Schwegman Lundberg & Woessner, P.A.

(57) ABSTRACT

A multiple-level driver circuit, such as for providing several different signals to a device under test (DUT) in an automated test system, can include multiple diode bridge circuits. In an example, a first diode bridge circuit is configured to receive a multiple-valued input voltage signal, having at least two different DC voltage signal levels, at an input node and, in response, to selectively provide a corresponding multiple-valued output voltage signal at an output node. The first diode bridge circuit can operate in a conducting and non-commutated state when it is used to selectively provide the multiple-valued output voltage signal at the output node.

17 Claims, 7 Drawing Sheets

| SIGNAL AT 506C | SWHP/SWHN | SWLP/SWLN | SWPP/SWPN | SWTP/SWTN |
|---|---|---|---|---|
| Vhigh | CLOSED | OPENED | CLOSED | OPENED |
| Vlow | OPENED | CLOSED | CLOSED | OPENED |
| Vterm | N/A | N/A | OPENED | CLOSED |

MULTIPLE-LEVEL DRIVER CIRCUIT WITH NON-COMMUTATING BRIDGE

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

In an example, a system for testing digital integrated circuits (ICs) includes a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a common 50 ohm resistor, which is then connected to the DUT node. In this way, transitions between the three levels can be realized by opening and closing the appropriate switches, such as with only one switch closed at any given time.

A feature of ATE test systems is an ability to deliver precisely timed Vhigh, Vlow, and Vterm signals or transitions to the DUT. It can be critical for a tester to provide substantially constant propagation delays for transitions between the three levels independent of temperature, frequency, duty cycle, pulse width or test vector history.

A problem with the switching system described above includes the so-called "first pulse problem" where a propagation delay of a given transition is influenced by the nature of previous transitions. This manifests as inconsistent, non-systematic, or unpredictable propagation delay times. For example, transition times from Vhigh-to-Vlow, Vlow-to-Vhigh, Vhigh/low-to-Vterm and Vterm-to-Vhigh/Vlow can each be different, complicating test system calibration and implementation. Such transition time inconsistencies can limit system performance, for example by dictating a minimum driving signal pulse width or a minimum duration of the termination mode. As system or test operating speeds increase, these limitations can compromise efficacy of a test system.

OVERVIEW

The present inventor has recognized, among other things, that a problem to be solved includes providing a test system that can deliver multiple DUT stimulus signals at different levels without introducing signal anomalies or propagation delay uncertainties at signal level transitions per the "first pulse problem". In an example, the problem includes a variable capacitance at an output node that depends upon the type or number of bridge circuits that are coupled to the output node. Increased capacitance at the output node can yield a longer output signal propagation delay. Generally, consistent and predictable propagation delay can be a pin driver performance metric or requirement, and therefore it can be important for a slew rate characteristic of the driver system to remain constant for all transitions, regardless of node capacitance or charging current. If a test system's slew rate varies, then the resulting timing uncertainties under test conditions can influence a test system's ability to properly identify compliant and non-compliant devices.

In an example, a solution to the above-described problem includes a pin driver system that includes first and second diode bridge circuits. The first diode bridge circuit can include a first diode bridge input node and a first diode bridge output node, and the first diode bridge circuit can be configured to receive a DC first voltage signal (e.g., Vterm) at the first diode bridge input node. The first diode bridge circuit can be enabled to provide a first output voltage signal, such as corresponding to the DC first voltage signal, at the first diode bridge output node. The solution can further include a second diode bridge circuit having a second diode bridge input node and a second diode bridge output node. The second diode bridge circuit can be configured to receive a multiple-valued input voltage signal (e.g., Vhigh and Vlow), having at least two different substantially DC voltage signal levels, at the second diode bridge input node. In response, the second diode bridge circuit can selectively provide a corresponding multiple-valued output voltage signal at the first diode bridge output node. The second diode bridge circuit is maintained in a non-commutated state when it is enabled to provide the multiple-valued output voltage signal at the first diode bridge output node. In an example, the solution includes an output buffer circuit including a buffer input node and a buffer output node, and the buffer input node is coupled to the first and second diode bridge output nodes.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. The present inventor contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

Figure 1:
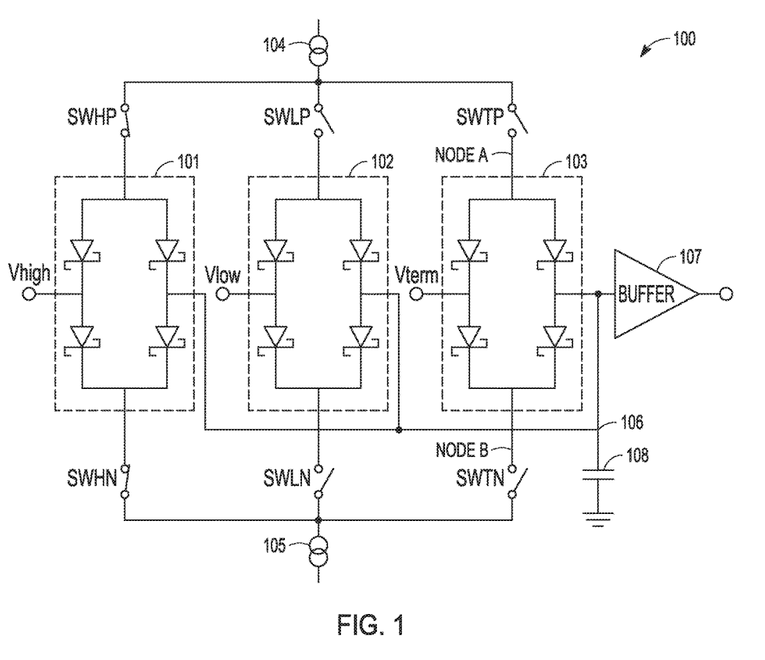
FIG. 1 illustrates generally a first example circuit of a switching stage of a driver circuit.

FIG. 1 illustrates generally a first example circuit 100 of a switching stage of a diode bridge-based pin driver circuit. The first example circuit 100 includes first, second, and third diode bridge circuits 101, 102, and 103. The first, second, and third diode bridge circuits 101, 102, and 103, are coupled to a common node 106. The common node 106 can be caused to transition between different DC voltage levels, including Vhigh, Vlow, and Vterm, based on the state of various switches and control signals in the first example circuit 100. In an example, each of the diode bridge circuits includes four (or more) diodes in a bridge configuration. Each bridge circuit can have a first pair of opposing nodes coupled to respective current sources and/or sinks, and can have a second pair of opposing nodes coupled to a signal node and an output node. In an example, each of the bridge circuits includes first, second, third, and fourth diodes, such as Schottky diodes. Other diode types can be used as well.

In an example, the first bridge circuit 101 can be coupled to first and second current sources 104 and 105 via high-signal switches SWHP and SWHN, respectively. An input side or input node of the first bridge circuit 101 can be coupled to a DC voltage signal source configured to provide the Vhigh voltage signal, and an output side or output node of the first bridge circuit 101 can be coupled to the common node 106. The first bridge circuit 101 can be configured to function as a switch for the input signal, such as Vhigh. When the high-signal switches SWHP and SWHN are closed, the first bridge circuit 101 conducts current from the first and second current sources 104 and 105, and the input signal Vhigh is passed or mirrored to the bridge circuit's output node. When the high-signal switches SWHP and SWHN are opened, the first bridge circuit 101 no longer conducts current, and the input signal Vhigh is inhibited from reaching the bridge circuit's output node.

The second and third bridge circuits 102 and 103 include similar arrangements to that of the first bridge circuit 101. For example, the second bridge circuit 102 can be coupled to the same first and second current sources 104 and 105 via low-signal switches SWLP and SWLN, respectively. One side of the second bridge circuit 102 can be coupled to a DC voltage signal source configured to provide the Vlow voltage signal, and an opposite side of the second bridge circuit 102 can be coupled to the common node 106. When the low-signal switches SWLP and SWLN are closed, the second bridge circuit 102 conducts current from the first and second current sources 104 and 105. The third bridge circuit 103 can be coupled to the same first and second current sources 104 and 105 via term-signal switches SWTP and SWTN, respectively. One side of the third bridge circuit 103 can be coupled to a DC voltage signal source configured to provide the Vterm voltage signal, and an opposite side of the third bridge circuit 103 can be coupled to the common node 106. When the term-signal switches SWTP and SWTN are closed, the third bridge circuit 103 conducts current from the first and second current sources 104 and 105. Generally, Vhigh corresponds to a relatively high amplitude voltage signal level (e.g., +5 volts), Vlow correspond to a relatively low amplitude voltage signal (e.g., +1 volt), and Vterm corresponds to an intermediate amplitude voltage signal (e.g., +2.5 volts). Other signal levels can similarly be used.

Generally, only one pair of the high-signal switches SWHP/SWHN, the low-signal switches SWLP/SWLN, and the term-signal switches SWTP/SWTN is closed at any given time, and the other pairs are open. That is, for example, if the high-signal switches SWHP and SWHN are closed and conducting current from the first and second current sources 104 and 105, then the low-signal switches SWLP and SWLN and the term-signal switches SWTP and SWTN are open. As a result, only one of the first, second, and third bridge circuits 101, 102, and 103, conducts current at any time given, and thus only the corresponding one of the DC voltage signals Vhigh, Vlow, and Vterm is supplied to the common node 106. In the example of FIG. 1, the high-signal switches SWHP and SWHN are closed, the low-signal switches SWLP and SWLN are open, and the term-signal switches SWTP and SWTN are open, and therefore the DC voltage signal Vhigh is provided to the common node 106.

Voltage signals at the common node 106 are presented to a buffer circuit 107, and the buffer circuit 107 can be coupled to, or configured to supply a signal to, a driver circuit output stage. Since the switches in the first example circuit 100 operate in pairs, and operate mutually exclusively as described above, the common node 106 can be fixed to one of the signal levels Vhigh, Vlow, and Vterm.

A pin driver circuit, such as can receive or use the signals Vhigh, Vlow, and Vterm from the first example circuit 100, can be configured to quickly adjust its output state to correspond to one of the different signal levels and to drive a DUT. During transitions from Vhigh-to-Vlow, or Vlow-to-Vhigh, the third bridge circuit 103 can be configured to have minimal influence on the common node 106, such as ideally exhibiting zero DC and zero AC loading on the common node 106.

Prior to an output signal transition event, a single one of the first, second, and third bridge circuits 101, 102, and 103 can be selected for use, for example, by closing the corresponding pair of switches SWHP/SWHN, SWLP/SWLN, or SWTP/SWTN. In an example where the selected one of the bridge circuits is a diode bridge circuit, the selected diode bridge circuit can be considered to be balanced, meaning that the diodes in the diode bridge circuit each conduct approximately the same amount of current (e.g., between the first and second current sources 104 and 105). When a given diode bridge circuit is balanced, then the common node 106 receives a voltage signal corresponding to an input signal at the balanced diode bridge circuit (e.g., corresponding to Vhigh, Vlow, or Vterm, in the example of FIG. 1). The other, non-selected bridge circuits are non-conducting since they are decoupled from the first and second current sources 104 and 105, and any input signals at the non-selected bridge circuits do not influence to the common node 106.

Following an output signal transition event, a previously-on (i.e., previously balanced) bridge circuit can be turned off, for example, by opening its corresponding switches and decoupling the previously-on bridge circuit from the first and second current sources 104 and 105. A different bridge circuit can be turned on, such as substantially concurrently, for example by closing its corresponding switches and thereby coupling the different bridge circuit to the first and second current sources 104 and 105. The different bridge circuit then can become balanced, or non-commutated, after a brief charging period. During the transition event, however, both participating bridge circuits can be unbalanced since one bridge circuit is off and the other is balanced or non-commutated. When one of the first, second, and third bridge circuits 101, 102, and 103 is non-commutated, then the non-commutated one of the bridge circuits is actively charging or feeding the common node 106 to the bridge circuit's corresponding DC signal value (e.g., Vhigh, Vlow, or Vterm). For example, in a Vhigh-to-Vlow transition event, the first bridge circuit 101 is non-commutated prior to the transition event, and the common node 106 can be charged to Vhigh. Following the transition event, the second bridge circuit 102 is non-commutated, and the common node 106 can be charged to Vlow. In between the time when the first and second bridge circuits 101 and 102 are non-commutated, however, the first and second current sources 104 and 105 charge the second bridge circuit 102, and also charge any stray capacitances that can be associated with the first, second, and third bridge circuits 101, 102, and 103, or associated with the common node 106. The various capacitance characteristics are considered collectively as a capacitance 108, illustrated in FIG. 1 as a capacitor coupled to the common node 106.

A transition voltage signal from Vhigh to Vlow at the common node 106 can be represented by a ramp signal with a negative slope, and a transition voltage signal from Vlow to Vhigh can be represented by a ramp signal with a positive slope. The slope of the ramp signals indicates the slew rate, or the transition time between Vhigh and Vlow states at the common node 106. The slew rate can be a function of, among other things, the magnitude of current signals provided by the first and second current sources 104 and 105, the capacitance 108, and other capacitances associated with any of the first, second, and third bridge circuits 101, 102, and 103.

Figure 2A:
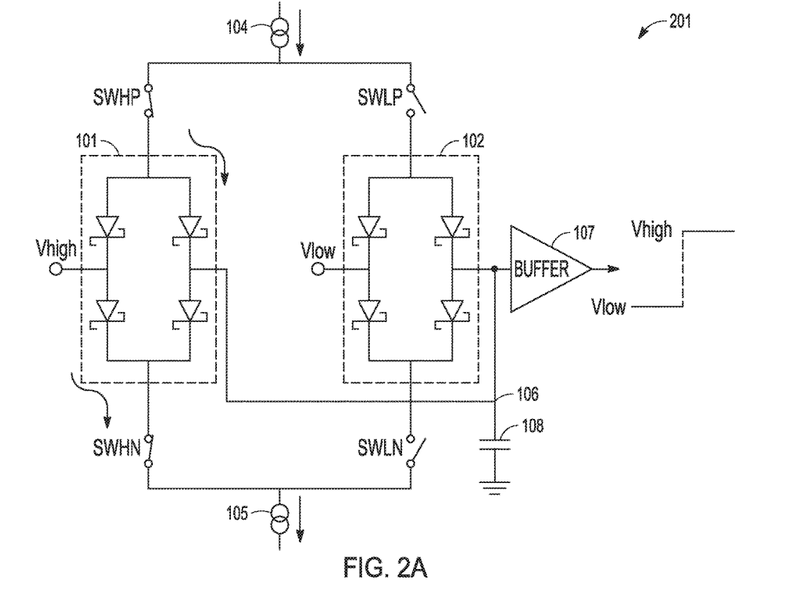
FIG. 2A illustrates generally an example that includes a Vlow-to-Vhigh transition at the common node of the first example circuit.

FIG. 2A illustrates generally an example 201 that includes a Vlow-to-Vhigh transition at the common node 106 of the first example circuit 100. In this example, the third bridge circuit 103 is omitted from the figure. FIG. 2A illustrates the circuit's configuration after the low-signal switches SWLP and SWLN are opened and the high-signal switches SWHP and SWHN are closed. Arrows near the first bridge circuit 101 signify current signals flowing through parallel legs of the first bridge circuit 101 from the first current source 104 to the second current source 105.

At right in FIG. 2A, the buffer circuit 107 provides an ideal output signal as a step function from Vlow to Vhigh. That is, under ideal and theoretical conditions, the output of the first example circuit 100 switches from Vlow to Vhigh with no ramping or slewing. In practice, however, various non-idealities are present in the circuit and the output is a ramp signal that exhibits delay, undershoot, overshoot, and other non-ideal characteristics. For example, capacitance at the common node 106 can affect the circuit's output signal timing characteristics.

Figure 2B:
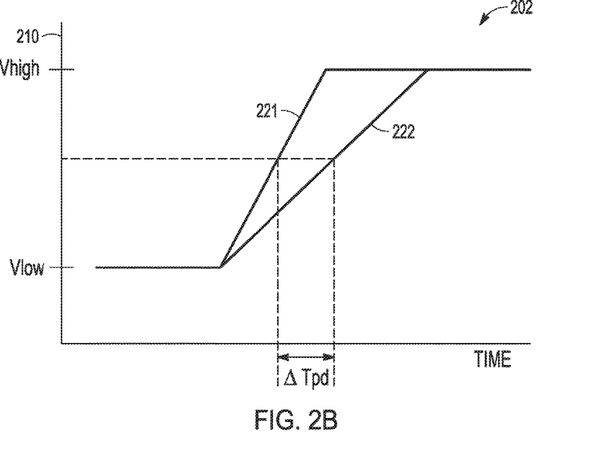
FIG. 2B illustrates generally an example of a signal plot for a voltage signal at the common node of the first example circuit.

FIG. 2B illustrates generally an example of a signal plot 210 for a voltage signal at the common node 106. The example of FIG. 2B describes an effect of node capacitance at the common node 106 for a Vlow-to-Vhigh transition. An output signal from the first example circuit 100 can depend, for example, on a charging current I at the common node 106, a capacitance C at the common node 106, and a transition waveform's slew rate, dV/dT. These variables can be related as I/C=dV/dT. That is, the transition waveform's slew rate can be proportional to the node capacitance and charging current at the common node 106.

In the example of FIG. 2B, first and second output waveforms 221 and 222 correspond to substantially the same charging current I provided at the common node 106. The first output waveform 221 corresponds to a relatively small node capacitance at the common node 106, and the second output waveform 222 corresponds to a relatively large node capacitance at the common node 106. When the common node 106 includes the relatively large node capacitance, the output signal transition duration from Vlow to Vhigh is increased relative to when the common node 106 includes the relatively small node capacitance. That is, increased capacitance at the common node 106 yields a longer propagation delay, ΔTpd. Generally, consistent and predictable propagation delay can be a pin driver performance metric or requirement, and therefore it can be important for the slew rate to remain substantially and predictably constant for all transitions, regardless of prior transition events. If a test system's slew rate varies, then the resulting timing uncertainties under test conditions can influence a test system's ability to properly identify compliant and non-compliant devices.

Multiple-level pin drivers, such as the first example circuit 100 of FIG. 1, can suffer from non-constant slew rates stemming from a variable, capacitive loading on node 106 due at least in part to the third bridge circuit 103. Since the slew rates are not constant, propagation delay uncertainties arise. This effect, sometimes termed the "first pulse problem", can arise from the third bridge circuit 103 storing voltage signals, such as from prior transition events, that can load or influence future transition events.

Figure 3:
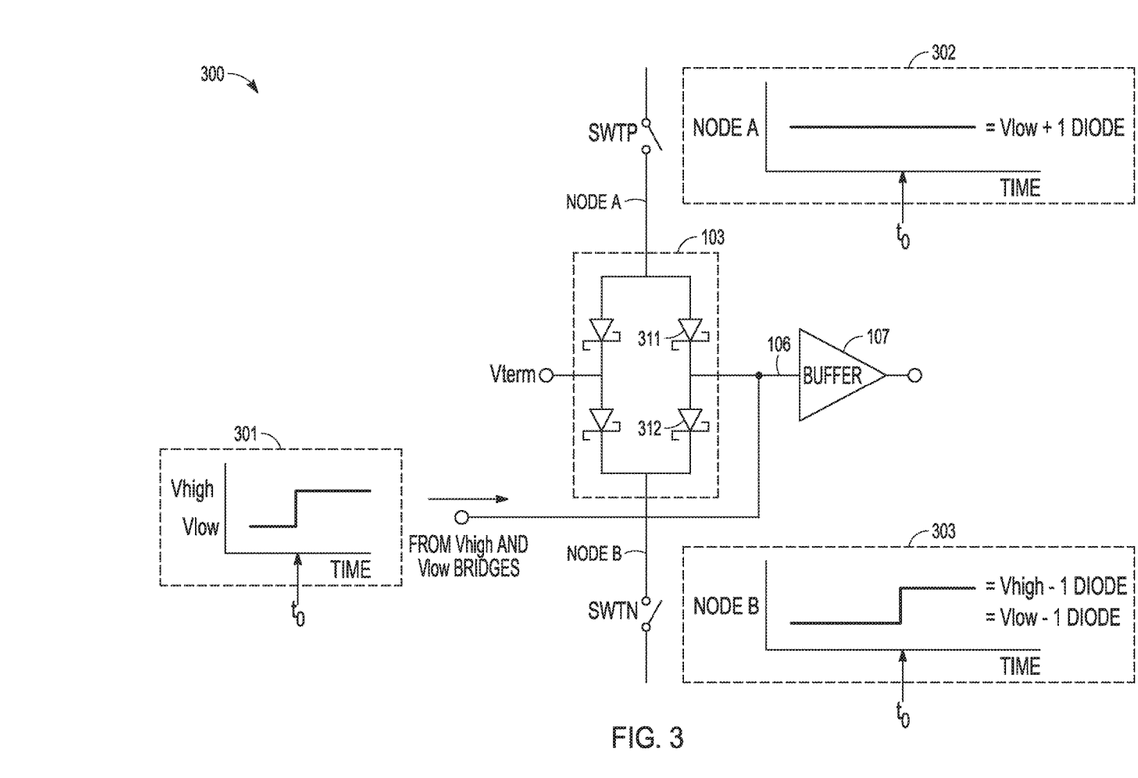
FIG. 3 illustrates generally an example that demonstrates an influence of the third bridge circuit of the first example circuit on an output signal transition event.

FIG. 3 illustrates generally an example 300 that includes the third bridge circuit 103 and demonstrates an influence of the third bridge circuit 103 on an output signal transition event. In the example 300, the third bridge circuit 103 includes Node A at a first side of the bridge circuit adjacent the term-signal switch SWTP, and Node B at an opposite second side of the bridge circuit adjacent the term-signal switch SWTN. At 301, FIG. 3 illustrates generally a Vlow to Vhigh transition event at time to at the common node 106. Since the third bridge circuit 103 includes an output at the common node 106, for example at its terminal opposite its Vterm input, the third bridge circuit 103 can passively load the common node 106 before, during, and after the transition event, such as even when the term-signal switches SWPT and SWTN are open.

The voltages at Node A and Node B over the transition event are illustrated at Node A chart 302 and Node B chart 303. Before the transition event at time to, the voltage at Node A is approximately one diode forward voltage (Vf) above Vlow. The diode forward voltage is introduced by a first diode 311 in the third bridge circuit 103 that is between the term-signal switch SWTP and the common node 106. When the voltage at the common node 106 transitions to Vhigh after time to, the voltage at Node A remains at one diode forward voltage above Vlow because the first diode 311 is reverse biased and the term-signal switch SWTP is open. At Node B and before the transition event at time to, the voltage is about Vlow less one diode forward voltage. The diode forward voltage is introduced by a second diode 312 in the third bridge circuit 103 that is between the term-signal switch SWTN and the common node 106. When the voltage at the common node 106 transitions to Vhigh after time to, the voltage at Node B increases to Vhigh less one diode forward voltage (corresponding to the second diode 312).

After Node A and Node B are charged, such as after receiving both a Vlow and Vhigh signal at the common node 106, the node voltages remain substantially unchanged for future transition events between Vlow and Vhigh. That is, when Node A and Node B are charged to (Vlow+Vf) and (Vhigh−Vf), respectively, then the third bridge circuit 103 provides nearly zero loading to the common node 106 for subsequent Vlow-to-Vhigh transitions and Vhigh-to-Vlow transitions.

A first pulse problem arises, however, when the third bridge circuit 103 participates in the signal switching rather than merely being present as a constant load on the common node 106. Transitioning the third bridge circuit 103 results in Node A and Node B voltages that can be dissimilar to the steady state node voltages attributed to Vlow and Vhigh.

Figure 4:
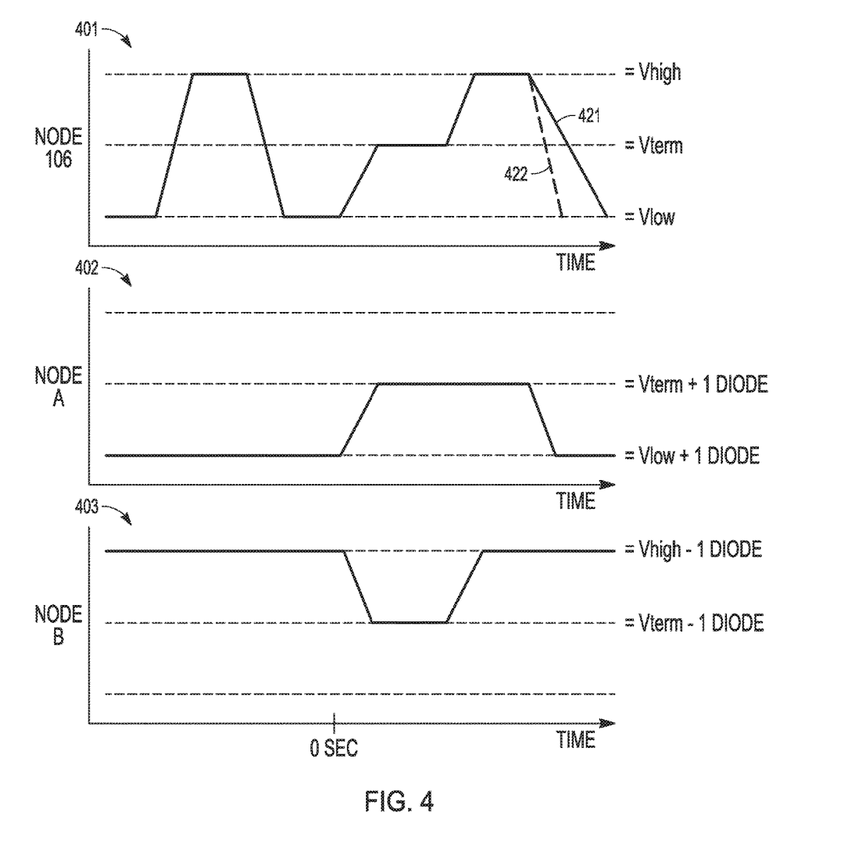
FIG. 4 illustrates generally voltage signals at the common node for multiple transition events.

FIG. 4 illustrates generally voltage signals at the common node 106, Node A, and Node B for Vlow-to-Vhigh transitions and for Vlow-to-Vterm-to-Vhigh transitions. In the example of FIG. 4, For time<0 sec, Node A is assumed to be charged to (Vlow+Vf), and Node B is assumed to be charged to (Vhigh−Vf), as discussed above.

At time t=0, a Vlow-to-Vterm transition occurs by switching off the low-signal switches SWLP and SWLN to decouple the first bridge circuit 101 from the first and second current sources 104 and 105, and by substantially concurrently switching on the term-signal switches SWTP and SWTN to couple the third bridge circuit 103 to the first and second current sources 104 and 105. After the transition to Vterm at the common node 106, the Node A voltage increases from (Vlow+Vf) to (Vterm+Vf), and the Node B voltage decreases from (Vhigh−Vf) to (Vterm−Vf). A first pulse problem then occurs on the first subsequent transition to either one of Vhigh and Vlow since the common node 106 effectively charges Node A and Node B back to their previous DC values of (Vlow+Vf) and (Vhigh−Vf), respectively. The voltage change magnitude to return Node A to (Vlow+Vf) is represented by 412, and the voltage change magnitude to return Node B to (Vhigh−Vf) is represented by 413. The first pulse problem manifests as relatively slower transitions at the common node 106, for example because the fixed first and second current sources 104 and 105 charge a capacitance at the common node 106 as described above, such as according to relationship I/C=dV/dT described above. As a result, slew rates are increased (i.e., transitions occur more slowly) for subsequent transitions from Vterm.

In other words, voltages at Node A and Node B can reach steady state or substantially constant values of (Vlow+Vf) and (Vhigh−Vf), respectively, when each of the first and second bridge circuits 101 and 102 are used in turn. If the third bridge circuit 103 is switched into the circuit, however, then the node voltages at Node A and Node B deviate from their steady state values, and the node voltages do not return to steady state until a Vlow-to-Vhigh transition or a Vhigh-to-Vlow transition occurs.

In the example of FIG. 4, the common node 106 voltage chart 401 illustrates a final transition that includes a Vhigh-to-Vlow transition, such as following a Vterm-to-Vhigh transition and a brief dwell at the Vhigh state. Due to the capacitive loading of the third bridge circuit 103 after the Vterm-to-Vhigh transition, the subsequent transition from Vhigh-to-Vlow can be relatively slow, as indicated by the first signal segment 421. When the first bridge circuit 101 is decoupled from the first and second current sources 104 and 105, for example, and the second bridge circuit 102 is coupled to the current sources, such as to transition from Vhigh to Vlow at the common node 106, then each of Node A and Node B settles over time back to its steady state value. Because of the intervening Vterm voltage at the common node 106, the settling time is increased relative to the case that includes only transitions between Vhigh and Vlow. A second signal segment 422 represents the transition ramp without the intervening Vterm voltage. That is, for Vlow-to-Vhigh-to-Vlow transitions, the second signal segment 422 represents the Vhigh-to-Vlow portion of the transition. For Vterm-to-Vhigh-to-Vlow transitions, the first signal segment 421 represents the Vhigh-to-Vlow portion of the transition.

In an example, a solution to the first pulse problem can include using a voltage source to drive current to the common node 106 when either of the first and second bridge circuits 101 and 102 are coupled to the common node 106 to provide states Vhigh and Vlow, respectively. By using a voltage source, or a current source providing an arbitrarily large amount of current, the capacitive loading effects of the third bridge circuit 103 on the common node 106 can be minimized, and transition times following Vterm states can be substantially more constant.

Figure 5A:
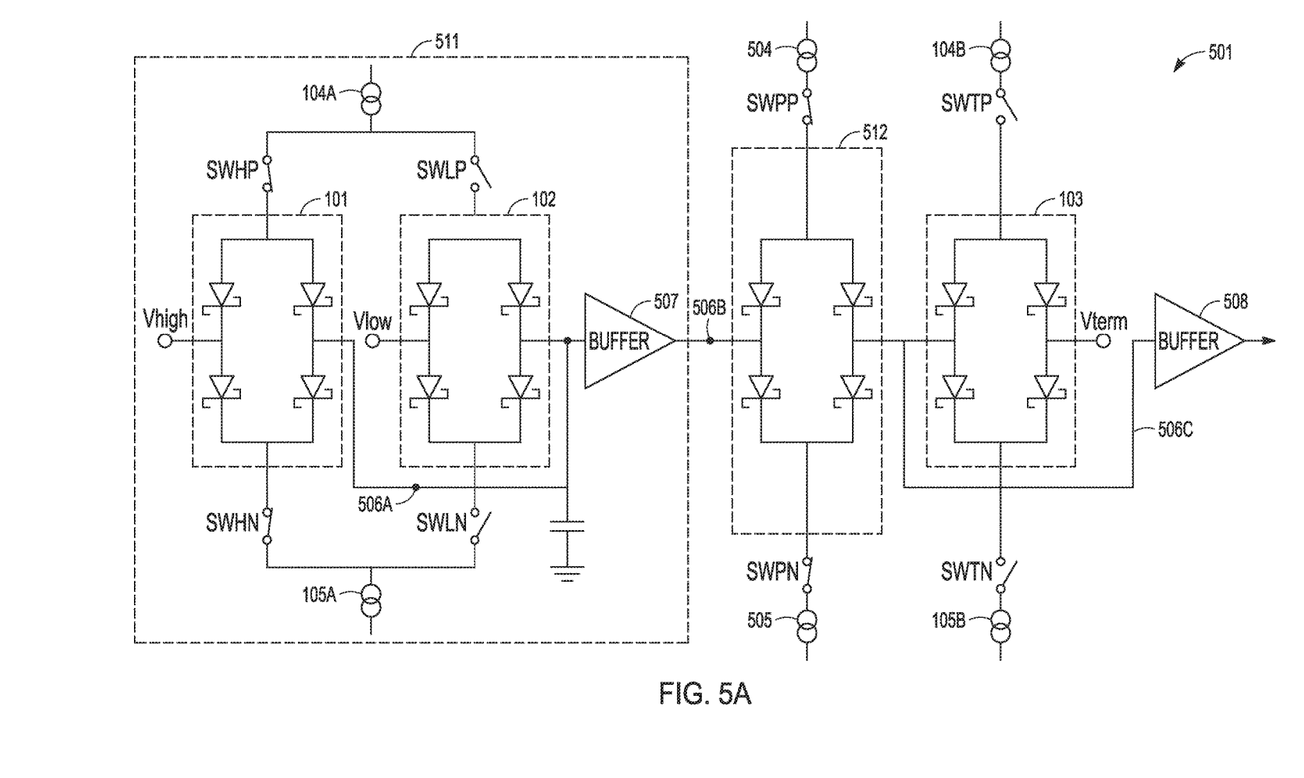
FIGS. 5A and 5B illustrate generally examples of switching stages of a driver circuit that includes a non-commutating bridge circuit.
Figure 5B:
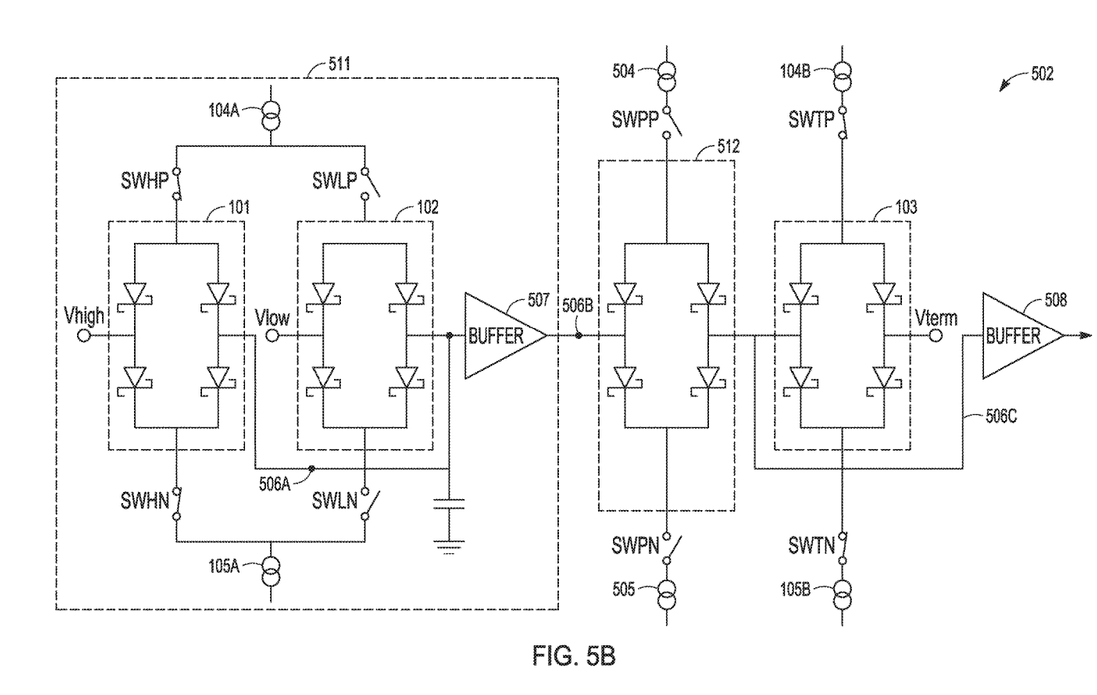

FIG. 5A illustrates generally a first example 501 of a switching stage of a driver circuit that includes a non-commutating bridge circuit in a first switching state. FIG. 5B illustrates generally a second example 502 of the switching stage of the driver circuit that includes the non-commutating bridge circuit in a second switching state. FIGS. 5A and 5B commonly illustrate a first switching stage 511 that includes the first and second bridge circuits 101 and 102. As described above in the example of FIG. 1, the first and second bridge circuits 101 and 102 can include diode bridge circuits configured to pass respective voltage signals between each bridge circuit's input and output nodes when a given one of the first and second bridge circuits 101 and 102 is active or coupled to a current source.

In the examples of FIGS. 5A and 5B, the first bridge circuit 101 is configured to receive a voltage signal Vhigh and selectively apply Vhigh at a first common node 506A. The second bridge circuit 102 can be configured to receive a different voltage signal Vlow and selectively apply Vlow at the first common node 506A. In an example, the first common node 506A is coupled to a first buffer circuit 507 that is configured to receive the Vhigh and Vlow signals from the first and second bridge circuits 101 and 102, respectively. The first and second bridge circuits 101 and 102 can provide Vhigh and Vlow, respectively, in a time-interleaved manner such that only one of Vhigh and Vlow is asserted at the first common node 506A at any given time.

In the example of FIGS. 5A and 5B, the first and second bridge circuits 101 and 102 are commonly coupled to first and second current sources 104A and 105A by way of switch pairs SWHP/SWHN and SWLP/SWLN, respectively. The first and second bridge circuits 101 and 102 can be used to provide Vhigh and Vlow signals to the first buffer circuit 507 by alternating an opened/closed status of the switch pairs SWHP/SWHN and SWLP/SWLN, respectively. That is, depending on the status of the switch pairs, one of the substantially DC voltage signals Vhigh and Vlow is provided to the first buffer circuit 507. As shown in the example of FIG. 5A, the high-signal switches SWHP and SWHN are closed and the low-signal switches SWLP and SWLN are opened and, as a result, Vhigh is provided at the first common node 506A to the first buffer circuit 507.

In an example, an output of the first buffer circuit 507 is coupled to a pass-through switching circuit 512 at a second common node 506B. The pass-through switching circuit 512 can include a diode bridge circuit that is coupled between the second common node 506B and a third common node 506C, and the third common node 506C can be coupled to an output buffer circuit 508. The output buffer circuit 508 can be configured to receive or supply a signal at a driver circuit output stage. The pass-through switching circuit 512 can be configured to act as a gate to signals received from the first buffer circuit 507. That is, the pass-through switching circuit 512 can pass a signal received from the first buffer circuit 507 to the third common node 506C under first conditions (see, e.g., FIG. 5A), and the pass-through switching circuit 512 can inhibit or prevent a signal received from the first buffer circuit 507 from reaching the third common node 506C under different second conditions (see, e.g., FIG. 5B). Correspondingly, the pass-through switching circuit 512 can pass or inhibit signal transfers from the third common node 506C to the second common node 506B.

The examples of FIGS. 5A and 5B further include the third bridge circuit 103 configured to provide a signal Vterm. The third bridge circuit 103 can include an input node that receives a voltage signal Vterm, and the third bridge circuit 103 can include an output node, opposite the input node, that is coupled to the third common node 506C. The third bridge circuit 103 can be coupled to current sources via term-signal switches SWTP and SWTN, as similarly described above in the example of FIG. 1. In the examples of FIGS. 5A and 5B, the term-signal switches SWTP and SWTN couple the third bridge circuit 103 to first and second term-signal current sources 104B and 105B. Although illustrated in the example of FIGS. 5A and 5B as separate sources, in an example, the first current source 104A and the first term-signal current source 104B can comprise a common current source, and the second current source 105A and the second term-signal current source 105B can comprise a different common current source.

In an example, the pass-through switching circuit 512 is configured to provide a switchable and arbitrarily large current signal at the third common node 506C, such as by modulating signals from first and second pass-through current sources 504 and 505 that are coupled to opposite sides of the pass-through switching circuit 512. The effects of the pass-through switching circuit 512 on the driver circuit can be determined based on the status of the pass-through switches SWPP and SWPN. In an example, the pass-through switching circuit 512 is inserted into the driver circuit when the first switching stage 511 is active, that is, when one of the first and second bridge circuits 101 and 102 is used to provide Vhigh or Vlow at the first common node 506A. In an example, the pass-through switching circuit 512 is removed or decoupled from the driver circuit when the third bridge circuit 103 is active and provides Vterm at the third common node 506C. By using the pass-through switching circuit 512 to selectively supply the Vhigh or Vlow signals at the third common node 506C, or to selectively decouple the first switching stage 511 from the driver circuit, issues such as the first pulse problem described above can be mitigated or eliminated. For example, the pass-through switching circuit 512 physically and electrically separates the third bridge circuit 103 from the first and second bridge circuits 101 and 102 under certain conditions, thereby reducing the mutual effects that the bridge circuits can have on each other.

The pass-through switching circuit 512 can include a diode bridge circuit that is configured to be operated primarily or exclusively in a non-commutating state. That is, the pass-through switching circuit 512 can include a bridge circuit, such as can be similarly configured to any one of the first, second, and third bridge circuits 101, 102, and 103. However, the bridge circuit of the pass-through switching circuit 512 can be configured to pass current signals from the first and second pass-through current sources 504 and 505 such that the semiconducting elements (e.g., diodes) of the bridge circuit do not commutate and the pass-through switching circuit 512 behaves like a voltage source at the third common node 506C. That is, the first and second pass-through current sources 504 and 505 can provide current signals at a sufficiently high magnitude to maintain the pass-through switching circuit 512 in a non-commutating state for expected values of Vhigh, Vlow, and Vterm, received from the first, second, and third bridge circuits 101, 102, and 103, respectively. In other words, by maintaining the pass-through switching circuit 512 in a non-commutating state, the pass-through switching circuit 512 functionally appears to be a voltage source that can supply an unlimited (or arbitrarily high) level of current at the third common node 506C. Since 512 does not commutate, the slew rate of 506C can be substantially independent of a capacitance on 506C and can be determined primarily by the slew rate at 506B.

In the example of FIGS. 5A and 5B, the first and second bridge circuits 101 and 102 are coupled to the first common node 506A, and the third bridge circuit 103, corresponding to Vterm, is decoupled from the first common node 506A. This results in the desirable outcome of faster rise and fall times of Vlow and Vhigh signal transitions at the first common node 506A, such as due to decreased capacitive loading at the first common node 506A for the given first and second current sources 104A and 105A. Signals Vlow or Vhigh at the first common node 506A are buffered by the first buffer circuit 507 and, when the pass-through switching circuit 512 is enabled, the signals are transmitted through the pass-through switching circuit 512 on the way to the third common node 506C and the output buffer circuit 508.

Signal transitions to or from Vterm can be provided by switching between the third bridge circuit 103 and the pass-through switching circuit 512 using the corresponding switch pairs SWTP/SWTN and SWPP/SWPN, respectively, such as while the first and second bridge circuits 101 and 102 remain active. That is, at least one of the first and second bridge circuits 101 and 102 can be coupled to the first and second current sources 104A and 105A at any given time, whether or not the third bridge circuit 103 is inserted into the driver circuit by closing the term-signal switches SWTP and SWTN. This is illustrated graphically in FIGS. 5A and 5B.

For example, FIG. 5A shows the driver circuit configured to deliver Vhigh to the third common node 506C by way of the pass-through switching circuit 512. In the first example 501 of FIG. 5A, switches SWHP and SWHN are closed and switches SWLP and SWLN are opened. The driver circuit can be alternatively configured to deliver Vlow when switches SWLP and SWLN are closed and switches SWHP and SWHN are opened.

In FIG. 5A, the third bridge circuit 103 corresponding to signal Vterm loads the third common node 506C, however, the third bridge circuit 103 does not contribute or apply the Vterm signal itself to the third common node 506C because the third bridge circuit 103 is decoupled from the first and second term-signal current sources 104B and 105B by way of the opened term-signal switches SWTP and SWTN. In the example of FIG. 5A, the pass-through switching circuit 512 is active, that is, it acts as a pass-through for the multiple-valued DC signals Vhigh and Vlow at the second common node 506B to reach the third common node 506C. Because the first and second pass-through current sources 504 and 505 provide arbitrarily high-magnitude current signals to the pass-through switching circuit 512, the pass-through switching circuit 512 is maintained in a non-commutating state and signals from the second common node 506B are mirrored to the third common node 506C and presented to the output buffer circuit 508.

The second example 502, in FIG. 5B, shows the driver circuit configured to deliver Vhigh to the first common node 506A, however, in this example the pass-through switching circuit 512 is configured to inhibit the Vhigh signal from reaching the third common node 506C. In this example, the pass-through switches SWPP and SWPN are opened, and the pass-through switching circuit 512 appears as a high impedance load from the perspective of the second and third common nodes 506B and 506C. In FIG. 5B, the term-signal switches SWTP and SWTN are closed and the first and second term-signal current sources 104B and 105B are coupled to the third bridge circuit 103. As a result, the third bridge circuit 103 is configured to pass Vterm to the third common node 506C. The Vterm signal does not penetrate the pass-through switching circuit 512 because the circuit appears as a high impedance. In the example of FIG. 5B, the pass-through switching circuit 512 is inactive, that is, it acts as a gate that inhibits signals at the second common node 506B from reaching the third common node 506C. As a result, only Vterm is presented to the third common node 506C and the output buffer circuit 508.

Node capacitance changes and other parasitic effects are introduced at the third common node 506C in response to changes in the switching status of the term-signal switches SWTP and SWTN. That is, the third bridge circuit 103 has a loading effect on the third bridge circuit 103 that is dependent upon whether Vterm is asserted by switching the term-signal switches SWTP and SWTN to a closed and conducting state. In the examples of FIGS. 1-4, such loading of the common node 106 by the third bridge circuit 103 introduced the first pulse problem, as described above. However, in the examples of FIGS. 5A and 5B, loading effects of the third bridge circuit 103 on the third common node 506C are minimized. Even though node parasitics and capacitances can change in the examples of FIGS. 5A and 5B similarly to the examples of FIGS. 1-4, such changes can be mitigated by a signal supplied by the pass-through switching circuit 512, which tends to act like a voltage source rather than a fixed current source.

In an example, the pass-through switching circuit 512 can be conceptualized as an analog signal transmission gate with a strength characteristic that can be modulated by the first and second pass-through current sources 504 and 505. The configuration can be susceptible to a charging memory of the third bridge circuit 103, however, the overall configuration of the first and second examples 501 and 502 in FIGS. 5A and 5B do not suffer from the first pulse problem. In an example, unlike the first and second bridge circuits 101 and 102 in the examples of FIGS. 1-4, the pass-through switching circuit 512 is made not to fully commutate while charging the third bridge circuit 103 at Vlow and Vhigh signal output levels (i.e., even when the term-signal switches SWTP and SWTN are opened and Vterm is not asserted). This is because the first and second pass-through current sources 504 and 505 can be selected to provide an arbitrarily large amount of current to avoid commutation of the pass-through switching circuit 512 for all expected values of Vhigh or Vlow.

During a Vlow-to-Vhigh transition, the pass-through switching circuit 512 is configured to behave as a small resistance rather than a current source. In the first and second examples 501 and 502, current provided to the third common node 506C via the pass-through switching circuit 512 is not limited by the relationship $I/C=dV/dT$, but instead as much current as needed can be delivered to recharge the third bridge circuit 103 at transitions (assuming sufficient current is available from the pass-through current sources 504 and 505). Slew rates of output signal transitions using the first and second examples 501 and 502 are thus not constrained by the $I/C=dV/dT$ relationship, and variable capacitive effects at the third common node 506C do not impact the slew rates of Vlow-to-Vhigh and Vhigh-to-Vlow transitions from the first and second bridge circuits 101 and 102. Thus, the first pulse problem is substantially mitigated or avoided using the first and second examples 501 and 502 illustrated in FIGS. 5A and 5B.

Figure 6:
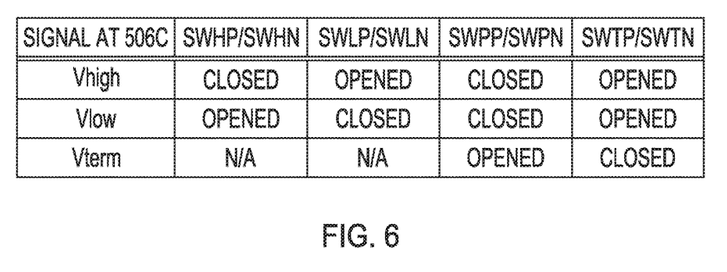
FIG. 6 illustrates generally an example of switching configurations for the example switching stages of FIGS. 5A and 5B.

FIG. 6 illustrates generally an example of multiple switching configurations for the first and second examples 501 and 502 of driver circuits according to FIGS. 5A and 5B. As illustrated in the example of FIG. 6, there are three different signals that can be made available at the third common node 506C, such as for providing to the output buffer circuit 508. The signals are Vhigh, Vlow, and Vterm. For each signal to reach the output buffer circuit 508, the various circuit switches can be configured as follows.

To provide signal Vhigh at the output buffer circuit 508, the first switching stage 511 is configured such that the first bridge circuit 101 conducts current from the first and second current sources 104A and 105A via the closed (i.e., conducting) high-signal switches SWHP and SWHN, and the second bridge circuit 102 is inhibited from conducting current because the low-signal switches SWLP and SWLN are opened (i.e., non-conducting). The pass-through switching circuit 512 is enabled and it mirrors or passes the Vhigh signal from the second common node 506B to the third common node 506C when the pass-through switches SWPP and SWPN are closed. In this example, the third bridge circuit 103 does not contribute Vterm to the third common node 506C because the term-signal switches SWTP and SWTN are opened.

To provide signal Vlow at the output buffer circuit 508, the first switching stage 511 is configured such that the second bridge circuit 102 conducts current from the first and second current sources 104A and 105A via the closed (i.e., conducting) low-signal switches SWLP and SWLN, and the first bridge circuit 101 is inhibited from conducting current because the high-signal switches SWHP and SWHN are opened (i.e., non-conducting). The pass-through switching circuit 512 is enabled and mirrors or passes the Vlow signal from the second common node 506B when the pass-through switches SWPP and SWPN are closed. In this example, the third bridge circuit 103 does not contribute Vterm to the third common node 506C because the term-signal switches SWTP and SWTN are opened.

At signal Vterm, the term-signal switches SWTP and SWTN corresponding to the third bridge circuit 103 are closed and Vterm is provided at the third common node 506C. To accurately provide Vterm, the pass-through switches SWPP and SWPN are opened to decouple signals originating from the first switching stage 511 from reaching the third common node 506C. Since the first switching stage 511 is electrically decoupled from the third common node 506C, the status of the high-signal switches SWHP and SWHN and/or the status of the low-signal switches SWLP and SWLN do not affect the voltage at the third common node 506C and at the output buffer circuit 508.

Figure 7:
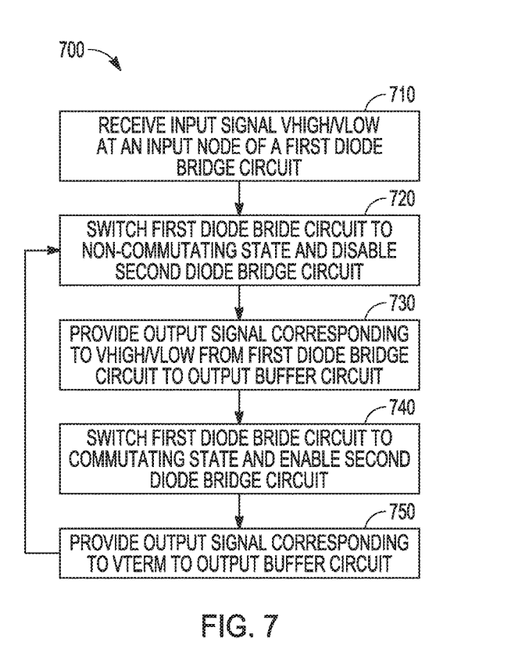
FIG. 7 illustrates generally an example of a method that includes switching a diode bridge circuit between commutating and non-commutating states.

FIG. 7 illustrates generally an example of a method 700 that includes switching a diode bridge circuit between commutating and non-commutating states. At operation 710, the example can include receiving an input signal at an input node of a first diode bridge circuit, such as the pass-through switching circuit 512 in the examples of FIGS. 5A and 5B. Operation 710 can include receiving an input signal that can include one of multiple different DC voltage signals, such as including Vhigh or Vlow, such as from the first or second bridge circuits 101 and 102.

At operation 720, the example can include switching the first diode bridge circuit to a non-commutating state. In an example, switching the first diode bridge circuit to a non-commutating state can include coupling the first diode bridge circuit to one or more current sources that are configured to provide a sufficiently large amount of current to the first diode bridge circuit such that at least some headroom or additional current-carrying capacity remains for any expected input signal value at an input of the first diode bridge circuit. When the first diode bridge circuit is enabled and switched to a non-commutating state, an input signal to the first diode bridge circuit, such as Vhigh or Vlow, can be provided to an output node, such as to the third common node 506C.

At operation 720, and substantially concurrently with switching the first diode bridge circuit to a non-commutating state, a second diode bridge circuit can be disabled. In this example, the second diode bridge circuit can include the third bridge circuit 103 from the example of FIGS. 5A and 5B that is configured to provide the voltage signal Vterm to the output when the third bridge circuit 103 is enabled. When the second diode bridge circuit is disabled, one or more current sources that are configured to supply a current signal to the second diode bridge circuit can be deactivated or decoupled from a signal path that includes the second diode bridge circuit. When the second diode bridge circuit is disabled, an input signal to the second diode bridge circuit can be inhibited or prevented from reaching the output node, such as the third common node 506C.

At operation 730, the example can include providing an output signal corresponding to Vhigh or Vlow from the first diode bridge circuit to the output node. The first diode bridge circuit can pass Vhigh to the circuit's output node when the first diode bridge circuit receives Vhigh at its input node (e.g., from the first bridge circuit 101), or the first diode bridge circuit can pass Vlow to the circuit's output node when the first diode bridge circuit receives Vlow at its input node (e.g., from the second bridge circuit 102). The Vhigh and Vlow signals are generally provided in a time-interleaved manner such that one or the other of Vhigh and Vlow is asserted at any given time, as similarly explained above in the example of FIG. 6. In an example, the output node includes an input to an output buffer circuit, and the output buffer circuit provides a DUT drive signal.

At operation 740, the example can include switching the first diode bridge circuit to a commutating state. When the first diode bridge circuit is disabled, or switched to a commutating state, one or more current sources that are configured to supply a current signal to the first diode bridge circuit can be deactivated or decoupled from a signal path that includes the first diode bridge circuit. When the first diode bridge circuit is commutating, an input signal to the first diode bridge circuit, such as Vhigh or Vlow, can be inhibited or prevented from reaching the output node.

At operation 740, and substantially concurrently with switching the first diode bridge circuit to a commutating state, the second diode bridge circuit can be enabled. Enabling the second diode bridge circuit can include coupling the second diode bridge circuit to one or more current sources. At operation 750, when the second diode bridge circuit is enabled, an input signal to the second diode bridge circuit, such as Vterm, can be provided to the output node.

Following operation 750, the first diode bridge circuit can be switched again to a commutating state to provide one of Vhigh or Vlow to the output node, and, substantially concurrently, the second diode bridge circuit can be disabled to inhibit Vterm from passing to the output node. The first diode bridge circuit is thus enabled, and non-commutating, when the second diode bridge circuit is disabled, and the first diode bridge circuit is disabled when the second diode bridge circuit is enabled.

VARIOUS NOTES & EXAMPLES

Example 1 can include or use subject matter such as a pin driver system. Example 1 can include a first diode bridge circuit including a first diode bridge input node and a first diode bridge output node, wherein the first diode bridge circuit is configured to receive a DC first voltage signal at the first diode bridge input node and selectively provide a corresponding first output voltage signal at the first diode bridge output node. Example 1 can further include a second diode bridge circuit including a second diode bridge input node and a second diode bridge output node, wherein the second diode bridge circuit is configured to receive a multiple-valued input voltage signal, having at least two different DC voltage signal levels, at the second diode bridge input node and selectively provide a corresponding multiple-valued output voltage signal at the first diode bridge output node. Example 1 can further include an output buffer circuit including a buffer input node and a buffer output node, wherein the buffer input node is coupled to the first and second diode bridge output nodes.

Example 2 can include, or can optionally be combined with the subject matter of Example 1, to optionally include the first and second diode bridge circuits configured to selectively receive current signals from different first and second current sources, respectively.

Example 3 can include, or can optionally be combined with the subject matter of Example 2, to optionally include the first current source configured to provide a first amount of current to the first diode bridge circuit and the second current source configured to provide a greater second amount of current to the second diode bridge circuit.

Example 4 can include, or can optionally be combined with the subject matter of Example 3, to optionally include the second current source configured to provide a sufficiently large amount of current to the second diode bridge circuit to maintain the second diode bridge circuit in a non-commutating state for multiple different levels of the multiple-valued input voltage signal.

Example 5 can include, or can optionally be combined with the subject matter of one or any combination of Examples 1 through 4 to optionally include the first and second diode bridge circuits being selectively enabled at mutually exclusive times.

Example 6 can include, or can optionally be combined with the subject matter of Example 5, to optionally include a first switch that selectively couples the first diode bridge circuit to a first current supply node, and a second switch that selectively couples the second diode bridge circuit to a different second current supply node.

Example 7 can include, or can optionally be combined with the subject matter of Example 6, to optionally include the first diode bridge circuit capacitively loads the buffer input node by first and different second capacitance amounts based on an opened/closed status of the first switch.

Example 8 can include, or can optionally be combined with the subject matter of one or any combination of Examples 1 through 7 to optionally include, as at least one of the first and second diode bridge circuits, a diode bridge comprising four Schottky diodes.

Example 9 can include, or can optionally be combined with the subject matter of one or any combination of Examples 1 through 8 to optionally include third and fourth diode bridge circuits that are configured to receive third and fourth respective DC voltage signals, wherein the third and fourth diode bridge circuits are configured to provide respective third and fourth output signal voltage signals to the second diode bridge input in a time-interleaved manner.

Example 10 can include, or can optionally be combined with the subject matter of one or any combination of Examples 1 through 9 to optionally include, in the second diode bridge circuit, an electrical signal path between the second diode bridge's input and output nodes, wherein the electrical signal path provides a first impedance when the second diode bridge circuit is provided with a first bias current, and provides a greater second impedance when the second diode bridge circuit is provided with a lesser second bias current.

Example 11 can include, or can optionally be combined with the subject matter of one or any combination of Examples 1 through 10 to optionally include an intermediate buffer circuit that is configured to provide the multiple-valued input voltage signal to the second diode bridge input node in response to DC voltage signals received from multiple other diode bridge circuits.

Example 12 can include, or can optionally be combined with the subject matter of one or any combination of Examples 1 through 11 to optionally include, subject matter such as a method for operating a pin driver system. The method of Example 12 can include receiving a first voltage input signal at a first node of a conducting and non-commutated first diode bridge circuit and, in response, providing a corresponding first voltage output signal from a second node of the first diode bridge circuit to an output buffer circuit, switching the first diode bridge circuit between conducting and non-conducting states to selectively provide the first voltage output signal from the second node of the first diode bridge circuit to the output buffer circuit, and when the first diode bridge circuit is switched to the non-conducting state, enabling a second diode bridge circuit to provide a different second voltage output signal to the output buffer circuit.

Example 13 can include, or can optionally be combined with the subject matter of Example 12, to optionally include switching the first diode bridge circuit to conducting and non-conducting states in a time-interleaved manner with respect to the enabling the second diode bridge circuit to provide the different second voltage output signal to the output buffer circuit.

Example 14 can include, or can optionally be combined with the subject matter of Example 13, to optionally include the switching the first diode bridge circuit between conducting and non-conducting states includes toggling a first switch coupled between a first current source and the first diode bridge circuit, and the enabling the second diode bridge circuit includes using a second switch to couple the second diode bridge circuit to a different second current source.

Example 15 can include, or can optionally be combined with the subject matter of one or any combination of Examples 12 through 14 to optionally include the switching the first diode bridge circuit between the conducting and non-conducting states includes coupling and decoupling the first diode bridge circuit with a first current supply node using a first switch, and the enabling the second diode bridge circuit to provide the different second voltage output signal includes coupling the second diode bridge circuit with a different second current supply node using a different second switch. In an example, the first and different second current supply nodes are configured to provide different amounts of current.

Example 16 can include, or can optionally be combined with the subject matter of one or any combination of Examples 12 through 15 to optionally include the receiving the first voltage input signal at the first node of the conducting and non-commutated first diode bridge circuit includes receiving, in a time-interleaved manner from third and fourth diode bridge circuits, a first DC signal having a first signal amplitude, and a second DC signal having a different second signal amplitude, respectively.

Example 17 can include, or can optionally be combined with the subject matter of one or any combination of Examples 12 through 16 to optionally include receiving, at an output buffer circuit, one or the other of the first voltage output signal from the first diode bridge circuit and the different second voltage output signal from the second diode bridge circuit, and in response providing a driver stage output signal using the output buffer circuit.

Example 18 can include or use subject matter such as a system that can include or use a first diode bridge circuit including a first diode bridge input node and a first diode bridge output node, wherein the first diode bridge circuit is configured to receive a DC first voltage signal at the first diode bridge input node and selectively provide a corresponding first output voltage signal at the first diode bridge output node. Example 18 can include a second diode bridge circuit including a second diode bridge input node and a second diode bridge output node, wherein the second diode bridge circuit is configured to receive a multiple-valued input voltage signal, having at least two different DC voltage signal levels, at the second diode bridge input node and, when the second diode bridge circuit is operated in a conducting and non-commutated manner, the second diode bridge circuit is configured to selectively provide a corresponding multiple-valued output voltage signal at the first diode bridge output node. In Example 18, the first diode bridge circuit can be configured to provide the first output voltage signal only when the second diode bridge circuit is substantially non-conducting.

Example 19 can include, or can optionally be combined with the subject matter of Example 18, to optionally include a first buffer circuit configured to provide the multiple-valued input voltage signal, having at least two different DC voltage signal levels, to the second diode bridge input node in response to one or more input signals at the first buffer circuit, and a second buffer circuit including an input node that is coupled to the output nodes of the first and second diode bridge circuits, and the second buffer circuit including an output node that is configured to be coupled to a device under test.

Example 20 can include, or can optionally be combined with the subject matter of Example 18 or Example 19, to optionally include a first current source configured to provide a first bias current signal to the first diode bridge circuit to enable the first diode bridge circuit to provide the first output voltage signal at the first diode bridge output node, and a second current source configured to provide a lesser second bias current signal to the second diode bridge circuit to enable the second diode bridge circuit to provide the multiple-valued output voltage signal at the first diode bridge output node.

Each of these non-limiting examples can stand on its own, or can be combined in various permutations or combinations with one or more of the other examples.

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A pin driver system to provide a drive signal to a device under test at a selected one of at least three non-zero voltage levels, the system comprising:
    a first diode bridge circuit configured to selectively provide, to a common node, a first diode bridge output voltage signal at a first voltage level;
    a second diode bridge circuit configured to receive a buffered switching signal and in response provide, to the common node, a switching stage output voltage signal at a selected one of second and third voltage levels that are each different than the first voltage level; and
    an output voltage buffer circuit configured to receive, from the common node, the first diode bridge output voltage signal at the first voltage level or the switching stage output voltage signal at the selected one of the second and third voltage levels, and in response provide the drive signal at a corresponding one of the first, second, and third voltage levels;
    wherein the first and second diode bridge circuits receive current signals from respective first and second current sources, and wherein the first current source is configured to provide a first amount of current to the first diode bridge circuit and the second current source is configured to provide a greater second amount of current to the second diode bridge circuit.

2. The system of claim 1, wherein the second current source is configured to provide a sufficiently large amount of current to the second diode bridge circuit to maintain the second diode bridge circuit in a non-commutating state for multiple different levels of the switching stage output voltage signal.

3. The system of claim 1, further comprising a first switch that selectively couples the first diode bridge circuit to a first current supply, and a second switch that selectively couples the second diode bridge circuit to a different second current supply.

4. The system of claim 3, wherein the first diode bridge circuit capacitively loads the common node by first and different second capacitance amounts based on an opened/closed status of the first switch.

5. The system of claim 1, further comprising a switching stage configured to provide the buffered switching signal to the second diode bridge circuit, wherein the switching stage comprises third and fourth diode bridge circuits that are configured to receive respective DC voltage signals, wherein the third and fourth diode bridge circuits are configured to provide the buffered switching signal at the second or third voltage levels in a time-interleaved manner.

6. The system of claim 1, wherein the second diode bridge circuit includes an electrical signal path between the second diode bridge circuit input and the second diode bridge circuit output wherein the electrical signal path provides a first impedance when the second diode bridge circuit is provided with a first bias current, and provides a greater second impedance when the second diode bridge circuit is provided with a lesser second bias current.

7. The system of claim 1, further comprising a switching stage configured to provide the buffered switching signal to the second diode bridge circuit from a first buffer circuit, wherein the first buffer circuit is configured to provide the buffered switching signal in response to DC voltage signals received from multiple other diode bridge circuits in the switching stage.

8. The system of claim 1, wherein:
when the first diode bridge circuit is disabled, the second diode bridge circuit is enabled and configured to transmit, to the common node, the switching stage output voltage signal at the selected one of the second and third voltage levels; and
when the first diode bridge circuit is enabled, the second diode bridge circuit is disabled and configured to inhibit transmission of the switching stage output voltage signal to the common node.

9. The system of claim 1, wherein the second diode bridge circuit includes a second diode bridge circuit input configured to receive the buffered switching signal and a second diode bridge circuit output configured to provide the switching stage output voltage signal to the common node when the second diode bridge circuit is operated in a conducting and non-commutated state.

10. A method for operating a pin driver system to provide a drive signal to a device under test at a selected one of three or more discrete and non-zero voltage levels, the method comprising:
in a time-interleaved manner, providing a first diode bridge output voltage signal at a first voltage level from a first diode bridge circuit to a common node when the first diode bridge circuit receives a first amount of current, and providing a switching stage output voltage signal from a second diode bridge circuit to the common node when the second diode bridge circuit receives a different second amount of current, wherein the switching stage output voltage signal has one of second or third voltage levels that are each different than the first voltage level; and
receiving, at an output voltage buffer circuit and from the common node, the first diode bridge output voltage signal or the switching stage output voltage signal; and
providing the drive signal from the output voltage buffer circuit at a corresponding one of the first, second, and third voltage levels based on the received one of the first diode bridge output voltage signal and the switching stage output voltage signal at the output voltage buffer circuit.

11. The method of claim 10, wherein providing the switching stage output voltage signal from the second diode bridge circuit to the common node comprises providing the switching stage output voltage signal using the second diode bridge circuit operative in a conducting and non-commutated state.

12. The method of claim 11, further comprising selectively inhibiting the first diode bridge circuit from providing the first diode bridge output voltage signal by toggling a first switch coupled between a first current source and the first diode bridge circuit, and selectively inhibiting the second diode bridge circuit from providing the switching stage output voltage signal by toggling a second switch coupled between a second current source and the second diode bridge circuit.

13. The method of claim 10, further comprising:
receiving, at a switching stage buffer circuit, first and different second DC signals from respective diode bridge circuits; and
providing the switching stage output voltage signal from the switching stage buffer circuit to the first diode bridge circuit based on the first and different second DC signals.

14. A pin driver system to provide a drive signal to a device under test at a selected one of a high voltage signal level, an intermediate voltage signal level, and a non-zero low voltage signal level, the pin driver system comprising:
a first current source configured to provide a first amount of bias current to a first diode bridge circuit to enable the first diode bridge circuit to selectively provide, to a common node, a first diode bridge output voltage signal at the intermediate voltage signal level;
second current source configured to provide a different second amount of bias current to a second diode bridge circuit, wherein the second diode bridge circuit is configured to receive a switching signal and in response provide, to the common node, a switching stage output voltage signal at a selected one of the high and low voltage signal levels; and
an output voltage buffer circuit configured to receive, from the common node, the first diode bridge output voltage signal at the intermediate voltage signal level or the switching stage output voltage signal at the selected one of the high and low voltage signal levels, and in response provide the drive signal at a corresponding one of the intermediate, high, or low voltage signal levels.

15. The pin driver system of claim 14, further comprising an input buffer circuit configured to provide the switching signal to the second diode bridge circuit, the input buffer circuit comprising at least second and third diode bridge circuits configured to respectively provide signals at the high and low voltage signal levels in a time-interleaved manner.

16. The pin driver system of claim 14, wherein the second diode bridge circuit is operated in a conducting and non-commutated state when the second diode bridge circuit provides the switching stage output voltage signal.

17. The pin driver system of claim 14, further comprising a switching stage configured to provide the switching signal to the second diode bridge circuit, wherein the switching stage comprises third and fourth diode bridge circuits that are configured to receive respective voltage signals at the high and low voltage signal levels, wherein the third and fourth diode bridge circuits are configured to provide the switching signal at the high and low voltage signal levels in a time-interleaved manner.

* * * * *